(12) United States Patent
Doi

(10) Patent No.: US 6,894,826 B2
(45) Date of Patent: May 17, 2005

(54) LIGHT SOURCE UNIT AND LIGHT IRRADIATION UNIT, AND DEVICE MANUFACTURING METHOD

(75) Inventor: Masaaki Doi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/640,023

(22) Filed: Aug. 14, 2003

(65) Prior Publication Data

US 2004/0160662 A1 Aug. 19, 2004

Related U.S. Application Data

(63) Continuation of application No. PCT/JP02/01262, filed on Feb. 14, 2002.

(30) Foreign Application Priority Data

Feb. 14, 2001 (JP) ........................................ 2001-036256

(51) Int. Cl.[7] .............................. G02F 2/02; H01S 3/10
(52) U.S. Cl. .......................... 359/326; 359/333; 372/21
(58) Field of Search ................................ 359/326–333; 372/21–22

(56) References Cited

U.S. PATENT DOCUMENTS 5,786,930 A * 7/1998 Takatsu et al. ............. 359/331
6,590,698 B1   7/2003 Ohtsuki et al. ............. 359/326

FOREIGN PATENT DOCUMENTS

| EP | 1 063 742 | 12/2000 |
| JP | 62-32674 | 2/1987 |
| JP | 64-49289 | 2/1989 |
| JP | 2000-250083 | 9/2000 |

* cited by examiner

*Primary Examiner*—John D. Lee
(74) *Attorney, Agent, or Firm*—Oblon, Spivak, McClelland, Maier & Neustadt, P.C.

(57) ABSTRACT

In an optical amplifying section that includes a specific amplifying medium that may be effected by a giant pulse, light subject to amplifying is continuously incoming, while exciting light is continuously supplied. Therefore, in the specific amplifying medium, the giant pulse is not generated, which allows continuous amplified light to be emitted stably from the specific amplifying medium. Meanwhile, of the light outgoing from the optical amplifying section, a light quantity controlling section controls the light quantity of light proceeding a predetermined optical path to a wavelength conversion section, which controls the light quantity of light outgoing from wavelength conversion section as outgoing light of the light source unit. As a consequence, light with high luminance whose wavelength has been converted can be stably emitted.

21 Claims, 7 Drawing Sheets

LIGHT SOURCE UNIT AND LIGHT IRRADIATION UNIT, AND DEVICE MANUFACTURING METHOD

CROSS-REFERENCE TO RELATED APPLICATIONS

This is a continuation of International Application PCT/JP02/01262, with an international filing date of Feb. 14, 2002, the entire content of which being hereby incorporated herein by reference, which was not published in English.

BACKGROUND OF THE INVENTION

1. Field of the Invention

The present invention relates to light source units and light irradiation units, and device manufacturing methods, and more particularly to a light source unit that generates light of a desired wavelength by converting the wavelength of light amplified by an optical amplifier, a light irradiation unit that comprises the light source unit, and a device manufacturing method that uses the light irradiation unit in a lithographic process.

2. Description of the Related Art

Light irradiation units are conventionally used for fine structure inspection of objects, fine processing of objects, and for vision correction treatment. For example, in a lithographic process for producing semiconductor devices or the like, in order to transfer a pattern formed on a mask or a reticle (hereinafter generally referred to as a 'reticle') onto a substrate such as a wafer on which a resist or the like is coated or a glass plate (hereinafter appropriately referred to as a 'substrate' or a 'wafer') via a projection optical system, exposure apparatus are used, which is a type of a light irradiation unit. As such an exposure apparatus, a static exposure type projection exposure apparatus that employs a step-and-repeat method, or a scanning exposure type projection exposure apparatus that employs a step-and-scan method is mainly used. In addition, for vision correction, a laser vision correction system, which is also a type of light irradiation unit, is used to perform ablation of the corneal layer (PRK: Photorefractive Keratectomy) or ablation of the inner cornea (LASIK: Laser Intrastromal Keratomileusis) for treatment of nearsightedness, astigmatism, or the like.

Many light sources that generate light having a short wavelength have been developed for such light irradiation units. The direction of development of such light sources with short wavelengths can be mainly divided into the following two groups: development of an excimer laser light source whose laser oscillation wavelength itself is short, and development of a short wavelength light source that makes use of harmonic generation of infrared or visible light laser.

Of such development, along the direction of the former group, a light source unit that uses a KrF excimer laser (wavelength: 248 nm) has been developed, and at present, a light source unit that uses an ArF excimer laser (wavelength: 193 nm) is being developed as a light source having shorter wavelength. However, such excimer lasers have their disadvantages as light source units, such as their large size, and their complicated maintenance operation and high running cost due to the hazardous fluorine gas used.

Therefore, a method of shortening the wavelength along the direction of the latter group is gathering attention, which is a method of converting long wavelength light (such as infrared light or visible light) into ultraviolet light with a shorter wavelength by using a nonlinear optical effect of a nonlinear optical crystal. As a light source that uses such a method, details are available in, for example, International Publication WO99/46835 (hereinafter simply referred to as a 'conventional example').

In the wavelength shortening method using nonlinear optical crystals as in the method described above, the generating efficiency of short wavelength light depends on the generation efficiency of the nonlinear optical effect of the nonlinear optical crystal, however, in the current state, the usable generation efficiency of the nonlinear optical effect of the nonlinear optical crystal is far from high. Therefore, in order to obtain high luminance ultraviolet light, a highly intense infrared light or visible light has to be incident on the nonlinear optical crystal. So, in the above conventional example, a structure is employed to amplify an infrared light or a visible light of a single wavelength generated by a semiconductor laser or the like, with an optical fiber amplifier that has an amplifying optical fiber in which a rare earth element is added, and to make it enter the nonlinear optical crystal.

In such an arrangement, for example, in order to continuously (including an optical pulse train whose pulse interval is sufficiently short compared with an pumping saturation time of an amplifying optical fiber in an optical fiber amplifier) emit ultraviolet light of high intensity during the exposure period of shot areas in the exposure apparatus, exciting light with high intensity needs to be continuously provided.

When light subject to amplifying does not enter the amplifying optical fiber over a period of time exceeding the pumping saturation time of the amplifying optical fiber, such as during a stepping period in the exposure apparatus, while the exciting light with high intensity is being continuously provided, and then the light subject to amplifying enters the amplifying optical fiber for exposure of the next shot area, light of an extremely high intensity (a so-called 'giant pulse') is generated instantly in the amplifying optical fiber immediately after its entrance. And, when such a giant pulse is generated, it had the potential to affect the amplifying optical fiber, as in damaging its fiber arrangement (a predetermined core/cladding structure and a distribution of additive elements) or the like.

In order to prevent the giant pulse from being generated, controlling the exciting light intensity can be considered, however, the responsiveness of optical amplifying ratio control by controlling the exciting light intensity is not necessarily high. Therefore, in order to stabilize the luminance of irradiation light required in an exposure apparatus or the like while preventing the structure of the amplifying optical fiber from being damaged, a complicated and sensitive control of exciting light intensity had to be performed.

SUMMARY OF THE INVENTION

The present invention was made under such circumstances, and has as its first object to provide a light source unit that has a simple arrangement, good durability, and whose outgoing beam on which wavelength conversion has been performed has more luminance and stability.

In addition, the second object of the present invention is to provide a light irradiation unit that can irradiate light with high luminance whose wavelength has been converted stably onto an object.

And, the third object of the present invention is to provide a device manufacturing method that can improve the productivity of a device.

According to a first aspect of the present invention, there is provided a light source unit, the unit comprising: an optical amplifying section that includes a specific amplifying medium that amplifies incoming light; a wavelength conversion section that performs wavelength conversion of light outgoing from the optical amplifying section; and a light quantity control section disposed on a predetermined optical path from the specific amplifying medium to the wavelength conversion section, the control section controlling light quantity of light proceeding the optical path after being emitted from the specific amplifying medium.

In the description, 'controlling light quantity' includes making the light quantity of the proceeding light become zero.

With this unit, on a predetermined path from the specifying amplifying medium to the wavelength conversion section that make up the optical amplifying section, a light quantity controller is provided that controls the light quantity of light proceeding the predetermined optical path after it is emitted from the specific amplifying medium. Therefore, because the light quantity controller can freely control the light quantity of light proceeding along the predetermined optical path from the specific amplifying medium to the wavelength conversion section, the light that enters the specific amplifying medium does not have to be controlled. For example, by using an amplifying medium such as an amplifying optical fiber that may be affected by generation of a giant pulse as the specific amplifying medium, light subject to amplifying can be continuously (including an optical pulse train whose pulse interval is sufficiently short compared with an pumping saturation time of an amplifying optical fiber in an optical fiber amplifier) incident on the specific amplifying medium while continuously supplying a sufficiently intense exciting light, and in the case where there are a plurality of amplifying mediums, the continuous light can be incident on the amplifying mediums in the former steps. Thus, the giant pulse is not generated in the amplifying medium up to the specific amplifying medium, which guarantees the durability of the components up to the specific amplifying medium. As a result, a continuous amplified light is emitted stably, from the specific amplifying medium.

And, because the light quantity controller controls the light quantity of light emitted from the specific amplifying medium that proceeds along the predetermined optical path to the wavelength conversion section, the light quantity of light outgoing from the wavelength conversion section serving as the outgoing light of the light source unit can be controlled freely, which in turn allows light with high luminance whose wavelength has been converted to be emitted stably, with good durability.

In this case, when a plurality of amplifying mediums is provided on an optical path inside the optical amplifying section, the specific amplifying medium can be an amplifying medium in the very last step. In addition, when a plurality of amplifying mediums that may be affected by a giant pulse is provided on an optical path inside the optical amplifying section, the specific amplifying medium can be an amplifying medium in the very last step among the amplifying mediums that may be affected by a giant pulse.

'Amplifying mediums that may be affected by a giant pulse' in this case, refers to an amplifying medium that may be affected by a giant pulse in a situation given that a giant pulse will be generated, since with the light source unit related to the presented invention, as is previously described, the giant pulse is not generated in the amplifying mediums up to the specific amplifying medium.

In the light source unit related to the present invention, the specific amplifying medium may be a rod shaped vitreous body, or for example, the specific amplifying medium can be an amplifying optical fiber.

In addition, as the light amount controller, a mechanical shutter unit may be used, however, the mechanical vibration may have an adverse influence on its surroundings. In such a case, with the light source unit related to the present invention, the light quantity control section can comprise: an acoustooptic medium disposed on the predetermined optical path; and a compressional wave generator that generates a compressional wave proceeding in a predetermined direction, in the acoustooptic medium.

In this case, the predetermined direction can be a direction oblique to a proceeding direction of light that has entered the acoustooptic medium, when the compressional wave is not generated in the acoustooptic medium. In such a case, using the so-called Bragg diffraction, the light quantity of the light proceeding along said predetermined optical path can be controlled.

In the light source unit related to the present invention, when the compressional wave is generated in the acoustooptic medium, at least a part of light outgoing from the specific amplifying medium can proceed the predetermined optical path, and when the compressional wave is not generated in the acoustooptic medium, light outgoing from the specific amplifying medium can proceed an optical path different from the predetermined optical path.

Besides what is described above, in the light source unit related to the present invention, when the compressional wave is generated in the acoustooptic medium, at least a part of light outgoing from the specific amplifying medium can proceed an optical path different from the predetermined optical path, and when the compressional wave is not generated in the acoustooptic medium, light outgoing from the specific amplifying medium can proceed the predetermined optical path.

Furthermore, in the light source unit related to the present invention, the light quantity control section can include a member that prevents a reflection wave from being generated in the compressional wave generator.

In addition, in the light source unit related to the present invention, the unit can further comprise: a laser generating section that generates a laser beam, which can be amplified by said specific amplifying medium, and emits the laser beam toward the optical amplifying section.

In this case, the laser generating section can generate a single wavelength laser beam within a wavelength range of infrared to visible region, and the wavelength conversion section emits ultraviolet light.

According to a second aspect of the present invention, there is provided a light irradiation unit that irradiates light onto an object, the unit comprising: the light source unit related to the present invention; and an irradiation optical system that emits light outgoing from the light source unit to the object.

With the light irradiation unit, light outgoing from the light source unit related to the present invention is irradiated on the object via the irradiation optical system, therefore, light with high luminance whose wavelength has been converted is irradiated in a stable manner.

In this case, as the object irradiated with the light, various objects are used, depending on the purpose of use of the light irradiation unit. For example, when the light irradiation unit is used for forming device patterns, the object can be a photosensitive object.

According to a third aspect of the present invention, there is provided a first exposure apparatus that transfers a pattern of a first object onto a second object, the apparatus comprising: the light source unit related to the present invention; and an illumination optical system that irradiates an illumination light outgoing from the light source unit onto the first object, and the apparatus exposes the second object with the illumination light via the first object.

In this case, the apparatus can further comprise: a stage system that moves the first object and the second object synchronously with respect to the illumination light, to perform scanning exposure on the second object with the illumination light; and a control unit that makes the illumination light enter the illumination optical system after the synchronous movement has begun and before beginning the scanning exposure, and controls irradiation of the illumination light to the first object via the light quantity control section.

In this case, the apparatus can further comprise: a projection optical system that projects a pattern image of the first object onto the second object; and a mark detection system that detects a mark with an illumination light outgoing from the light source unit via the projection optical system.

According to a fourth aspect of the present invention, there is provided a second exposure apparatus, comprising an illumination optical system that irradiates an exposure light on a first object, and a projection optical system that projects a pattern image of the first object on a second object, the apparatus comprising: the light source unit related to the present invention; and a mark detection system that detects a mark with an illumination light of substantially the same wavelength as the exposure light outgoing from the light source unit via the projection optical system.

In addition, in a lithographic process, by using the light irradiation unit related to the present invention that uses a photosensitive object as the object to perform exposure of the photosensitive object, a pattern can be formed with good accuracy on the photosensitive object, which in turn allows highly integrated microdevices to be produced with good productivity (including yield). Accordingly, further from another aspect of the present invention, it can also be said that the present invention is a device manufacturing method that uses the light irradiation unit related to the present invention.

BRIEF DESCRIPTION OF THE DRAWINGS

In the accompanying drawings.

DESCRIPTION OF THE PREFERRED EMBODIMENTS

An embodiment of the present invention is described below, referring to FIGS. 1 to 6.

Figure 1:
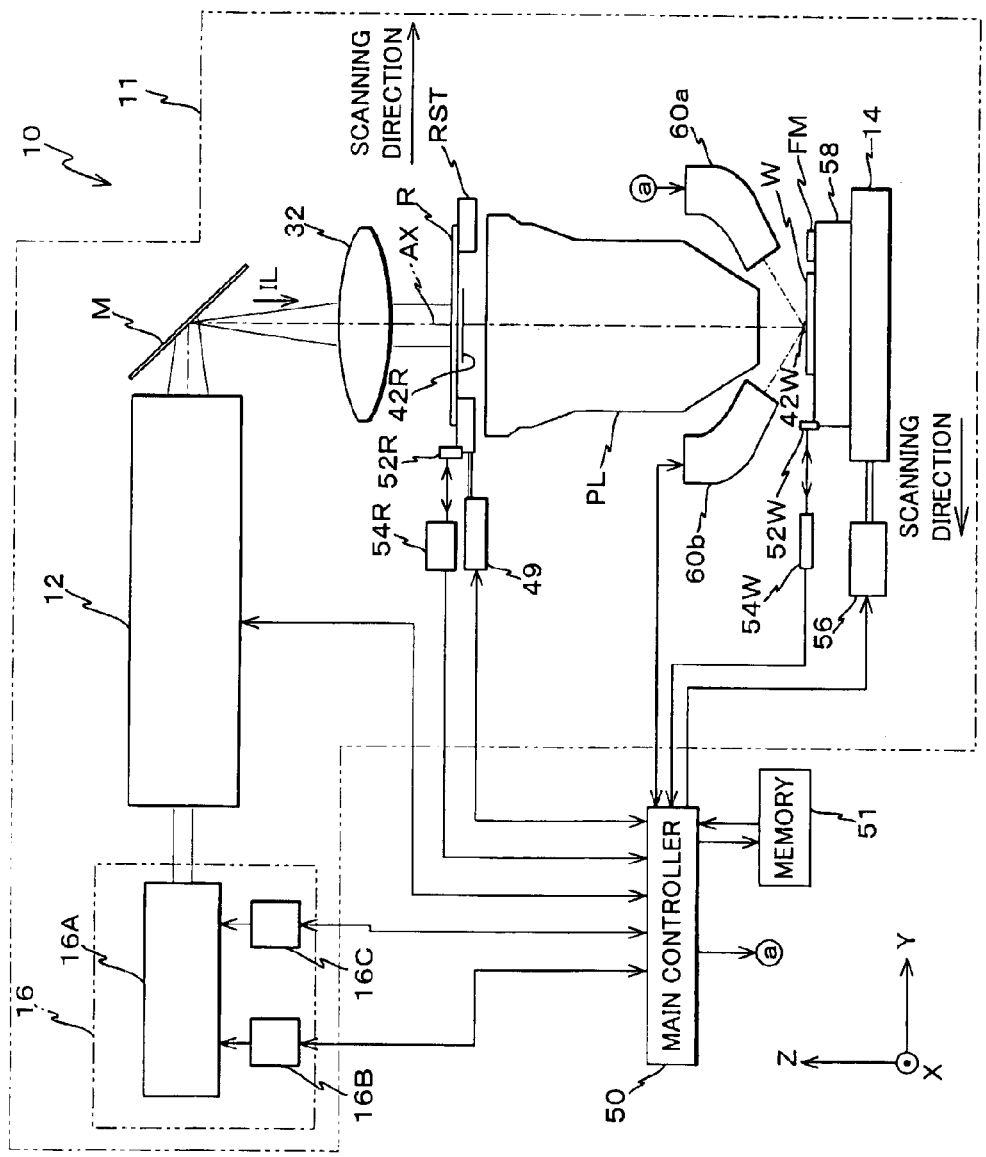
FIG. 1 is a view showing a structure of an exposure apparatus related to an embodiment of the present invention.

FIG. 1 shows an overall structure of an exposure apparatus 10, which is a light irradiation unit related to an embodiment being structured including a light source unit related to the present invention. Exposure apparatus 10 is a scanning exposure apparatus based on a step-and-scan method.

Exposure apparatus 10 comprises: an illumination system, which is made up of a light source unit 16 and an illumination optical system 12; a reticle stage RST that holds a reticle R serving as a mask, which is illuminated with an exposure illumination light (hereinafter referred to as 'exposure light') IL emitted from the illumination system; a projection optical system PL that projects exposure light IL on a wafer W serving as an object (photosensitive object) via reticle R; an XY stage 14 on which a Z tilt stage 58 that holds wafer W is mounted; and a control system for these parts.

Light source unit 16, for example, is a harmonic generating unit that emits an ultraviolet pulse light having a wavelength of 193 nm (substantially the same wavelength as an ArF excimer laser beam) or an ultraviolet pulse light having a wavelength of 157 nm (substantially the same wavelength as an $F_2$ laser beam) Light source unit 16 is housed in an environmental chamber (hereinafter referred to as 'chamber') 11 where temperature, pressure, and humidity or the like are precisely adjusted, along with an exposure apparatus main body, which is made up of illumination optical system 12, reticle stage RST, projection optical system PL, Z tilt stage 58, XY stage 14, main body column (not shown) in which these parts are placed, and the like.

In the embodiment, all parts of light source unit 16 are arranged within the chamber. However, a part of light source unit 16 may be partly arranged in the chamber; for example, a wavelength conversion section 163 which will be described later may be provided especially in the same frame as illumination optical system 12, and connected with a main body portion of light source unit 16 via an optical fiber or the like.

Figure 2:
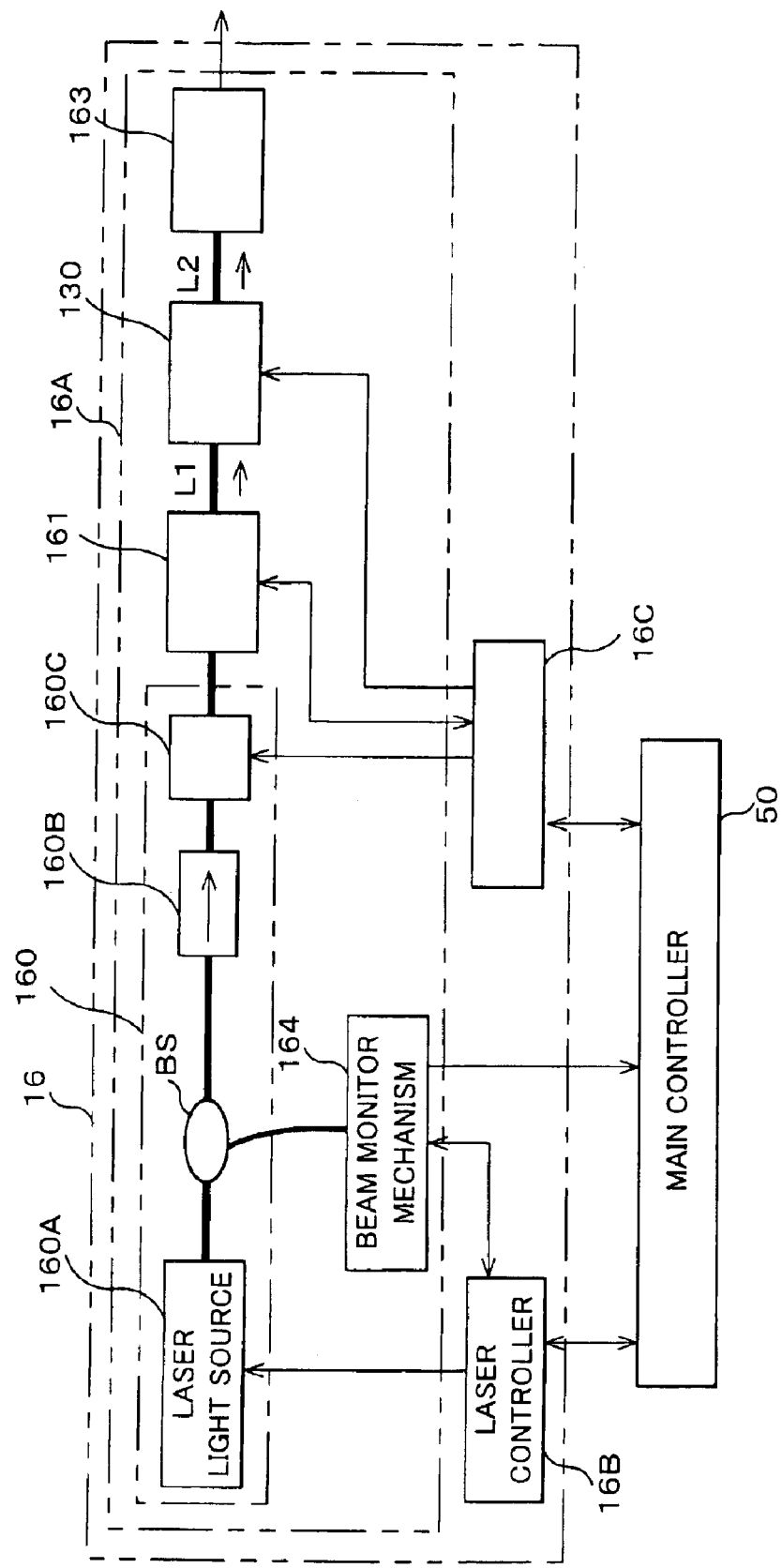
FIG. 2 is a block diagram that shows an inner structure of a light source unit in FIG. 1, with a main controller.

FIG. 2 shows a block diagram of an internal arrangement of light source unit 16 with a main controller 50 that has overall control over the entire apparatus. As is shown in FIG. 2, light source unit 16 is made up of parts including light source 16A, laser controller 16B, a first light quantity controller 16C, and the like.

Light source 16A is made up including a pulsed light generating section 160 that serves as a laser generating section, an optical amplifying section 161, a wavelength conversion section 163, a beam monitor mechanism 164, a second light quantity controller 130, and the like.

Pulsed light generating section 160 has parts such as a laser light source 160A, an optical coupler BS, an optical isolator 160B, and an electrooptical modulator (hereinafter referred to as 'EOM') 160C serving as an optical modulator.

As laser light source 160A, in this case, a single wavelength oscillation laser is used, for example, an InGaAsP DFB semiconductor laser is used that has oscillation wavelength of 1.544 $\mu$m and a continuous wave output (hereinafter referred to as 'CW output') of 20 mW. Hereinafter, laser light source 160A will be appropriately referred to as a 'DFB semiconductor laser 160A'.

DFB semiconductor laser is normally provided on a heatsink, and both the laser and heatsink are stored in a housing. In the embodiment, a thermoregulator (for example, a Peltier element) is provided on the annex heatsink to the DFB semiconductor laser 160A, and the oscillation wavelength can be controlled (adjusted) by laser controller 16B controlling the temperature.

As optical coupler BS, a coupler whose transmittance is around 97% is used. Therefore, the laser beam from DFB semiconductor laser diverges into two beams; one, which is around 97%, proceeding to the following step to optical isolator 160B, and the other, which is around 3%, entering beam monitor mechanism 164.

Beam monitor mechanism 164 includes an energy monitor (not shown) made up of photoelectric conversion elements such as photodiodes. The output of the energy monitor is supplied to main controller 50 via laser controller 16B, and main controller 50 detects the energy power of the laser beam based on the output of the energy monitor and controls the light quantity of the laser beam oscillated in DFB semiconductor 160A via laser controller 16B, when necessary.

Optical isolator 160B allows only the beam proceeding from optical coupler BS to EOM160C to pass, and blocks the beam that proceeds in the opposite direction. Optical isolator 160B prevents the change in the oscillation mode of DFB semiconductor laser 160A and noise from being generated due to reflected light (returning light).

EOM160C converts the laser beam having passed through optical isolator 160B (CW beam (continuous light)) into a pulsed light. As EOM160C, an electrooptical modulator (such as a dual electrode modulator) is used that has an electrode structure on which chirp correction has been performed, so as to narrow the wavelength broadening of the semiconductor laser output due to chirp occurring due to the temporal change in the refraction index. EOM160C outputs a pulsed light, which is modulated in sync with the voltage pulse applied from the first light quantity controller 16C. The optical pulse train output from EOM160C is shorter than the time required for pumping all the additive elements in an amplifying optical fiber 175 in optical amplifying section 161, which will be referred to later in the description, and from the amplifying point of view in amplifying optical fiber 175 it can be regarded as a continuous light. For example, EOM160C modulates the laser beam oscillated with DFB semiconductor laser 160a into a pulsed light having a pulse width of 1 ns and a repetition frequency of 100 kHz (pulse cycle around 10 $\mu$s). As the repetition frequency, a value that can suppress the influence of ASE (Amplified Spontaneous Emission) noise in the optical fiber amplifier is chosen.

The output light is preferably pulsed, in combination with the usage of the applied voltage to EOM160C and the supplied current control to DFB semiconductor laser 160A. In such a case, the extinction ratio can be improved. This allows easy generation of pulsed light of a narrow pulse width while the extinction ratio is improved and a more simple control of the oscillation interval of the pulsed light and the start/stop of the oscillation, compared with when only EOM160C is used. In addition, instead of EOM160, an acoustic optical modulator (AMO) can also be used.

Figure 3:
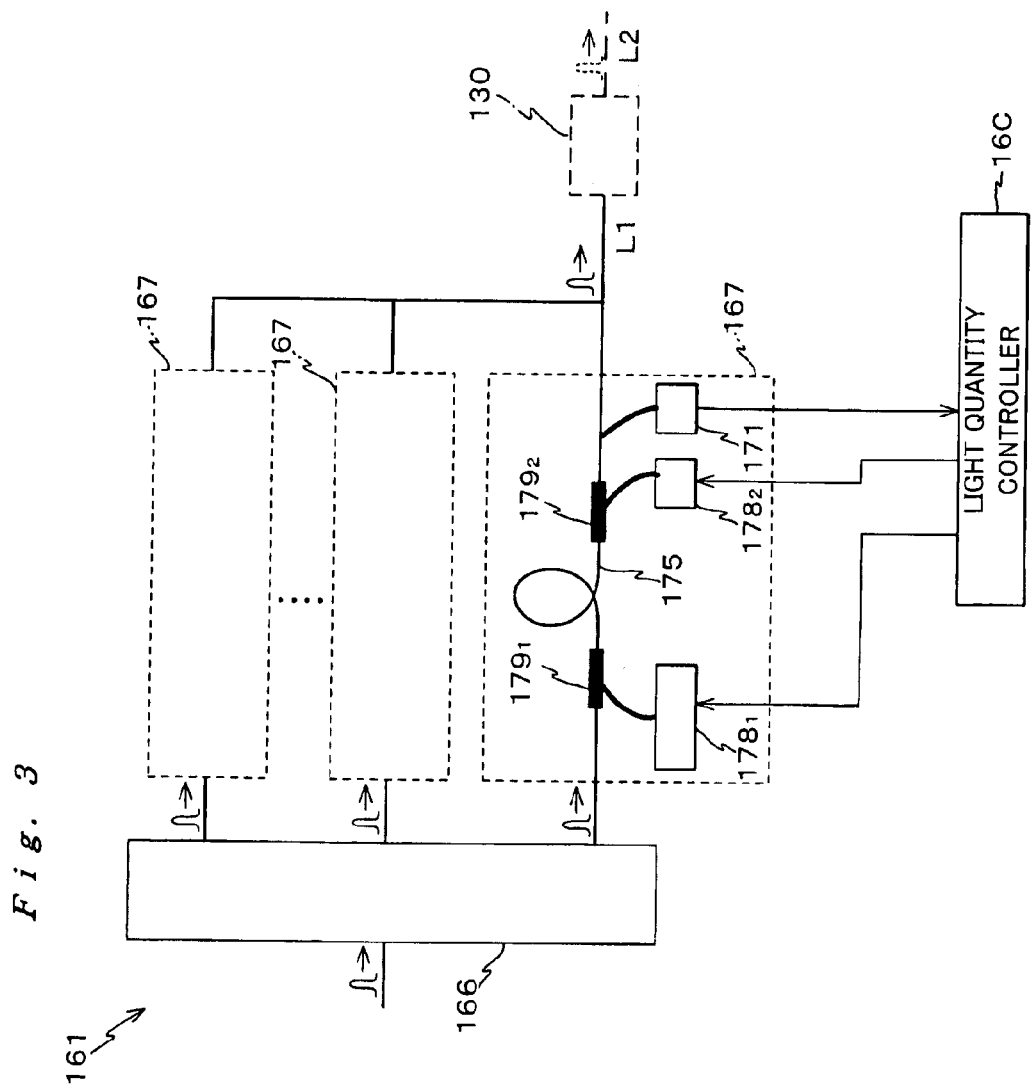
FIG. 3 is a schematic view of an optical fiber amplifier that make up an optical amplifying section in FIG. 2 and its periphery portion, with a part of a wavelength conversion section.

Optical amplifying section 161 amplifies the pulsed light from EOM160C, and as is shown in FIG. 3, is structured including an optical branching device 166 that periodically sorts and diverges (for example, 128 branches) the pulsed light from EOM160C in temporal order, and a plurality of optical fiber amplifiers 167.

As is shown in FIG. 3, optical fiber amplifier 167 comprises: amplifying optical fiber 175 serving as an amplifying medium; pumping semiconductor lasers $178_1$ and $178_2$ that generate a pump light; a wavelength division multiplexer (WDM) $179_1$ and $179_2$ that synthesizes the output light of EOM160C and the pump light described above, and provides the synthesized light obtained in the described manner to amplifying optical fiber 175. Pumping semiconductor laser $178_1$ and WDM$179_1$ are used in forward pumping configuration, whereas pumping semiconductor laser $178_2$ and WDM$179_2$ are used in backward pumping configuration. This arrangement maintains linearity of the optical amplifying ratio with respect to the entering light intensity, and also improves the optical amplifying ratio.

The main material of amplifying optical fiber 175 is silica glass or a phosphate glass. Amplifying optical fiber 175 has a core/cladding, and as the core an optical fiber doped in high density with erbium (Er), or two types of ions, Er and ytterbium (Yb).

In optical fiber amplifier 167 structured in the manner described above, when a pulsed light enters amplifying optical fiber 175 and proceeds its core via WDM $179_1$, in a state where the pump lights generated by pumping semiconductor lasers $178_1$ and $178_2$ are provided to amplifying optical fiber 175 via WDM $179_1$ and $179_2$, an induced radiation is generated and the pulsed light amplified. In such optical amplifying, because amplifying optical fiber 175 has a high amplifying ratio, a high luminance pulsed light is output whose unity of wavelength is high. Therefore, a narrowbanded light can be efficiently obtained.

Pumping semiconductor lasers $178_1$ and $178_2$ generate light whose wavelength is shorter than the oscillation wavelength in DFB semiconductor laser 160A (for example, 980 nm) as the pump light. The pump light is supplied to amplifying optical fiber 175 via WDM $179_1$ and $179_2$, which pumps the electrons of Er outside the shell, which in turn generates a so-called energy level population inversion. Pumping semiconductor lasers $178_1$ and $178_2$ operate under the control of the first light quantity controller 16C.

In addition, in the embodiment, in order to suppress gain difference in each of the optical fiber amplifiers 167, a part of the output light is branched inside optical fiber amplifier 167, and at the end of the branch a photoelectric conversion element 171 is provided to photoelectrically convert the branched light. The output signals of photoelectric conversion element 171 are supplied to the first light quantity controller 16C.

The first light quantity controller 16C feedback controls the drive current of pumping semiconductor lasers $178_1$ and $178_2$ so as to make the light output from each of the optical fiber amplifiers 167 stable (that is, balanced).

Figure 4:
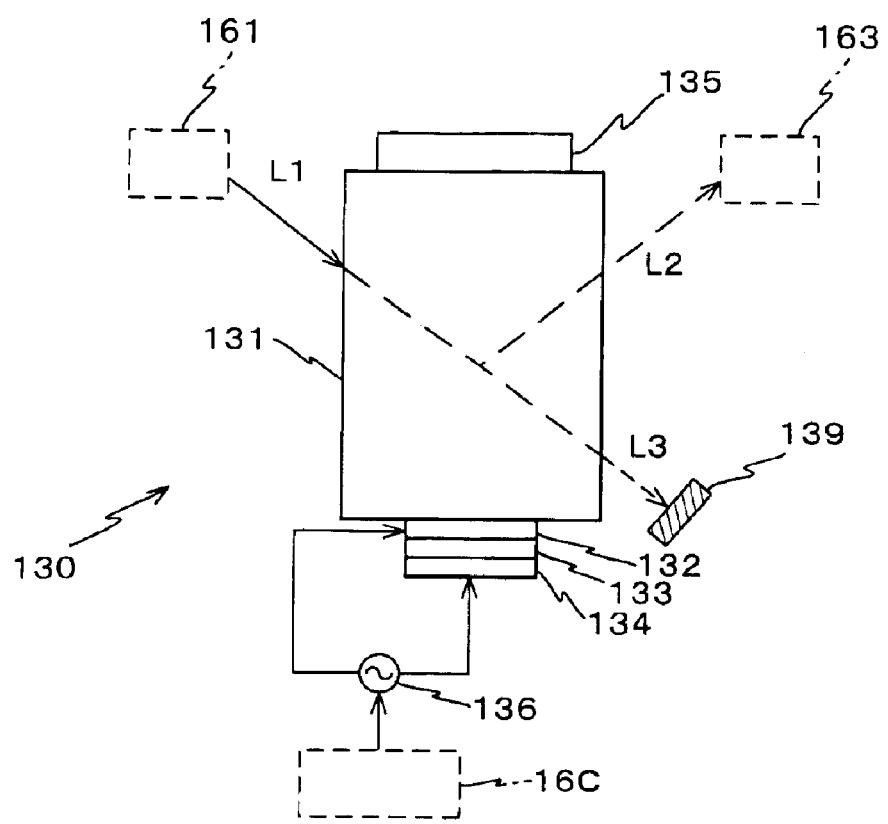
FIG. 4 is a view that schematically shows a structure of a second light quantity controller in FIG. 2.

The second light quantity controller 130 controls the light quantity of light proceeding towards wavelength conversion section 163 of the light emitted from optical amplifying section 161, in response to instructions from the first controller 16C. As is shown in FIG. 4, the second light quantity controller 130 comprises: an acoustooptic medium 131; an electrode plate 132, a transducer 133 for generating ultrasonic waves; and an electrode plate 134, sequentially fixed on a side surface of acoustooptic medium 131. In addition, the second light quantity controller 130 comprises an acoustic material 135, which is fixed on the other side surface of acoustooptic medium 131.

Furthermore, the second light quantity controller 130 comprises a signal generating unit 136, which is disposed in between electrode plates 132 and 134 for supplying radio frequency (RF) signals (drive signals), and a light shielding absorption plate 139. Signal generating unit 136 generates RF signals in response to instructions from the first light amount controller 16C.

As acoustooptic medium 131, other than glass, a single crystal of tellurium dioxide ($TeO_2$), quartz (including crystal), a single crystal of lead molybdate, or the like can be used. In addition, as acoustic material 135, a member can be used, whose acoustic impedance is close to that of acoustooptic medium 131 and is made up of a material that can easily absorb acoustic waves. To be more specific, a metal membrane such as lead or aluminum can be used. In addition, as transducer 133, a single crystal of lithium niobate ($LiNbO_3$), a single crystal of $LiIO_3$, a single crystal of $Ba_3NaNb_5O_{15}$, or the like can be used.

Figure 5A:
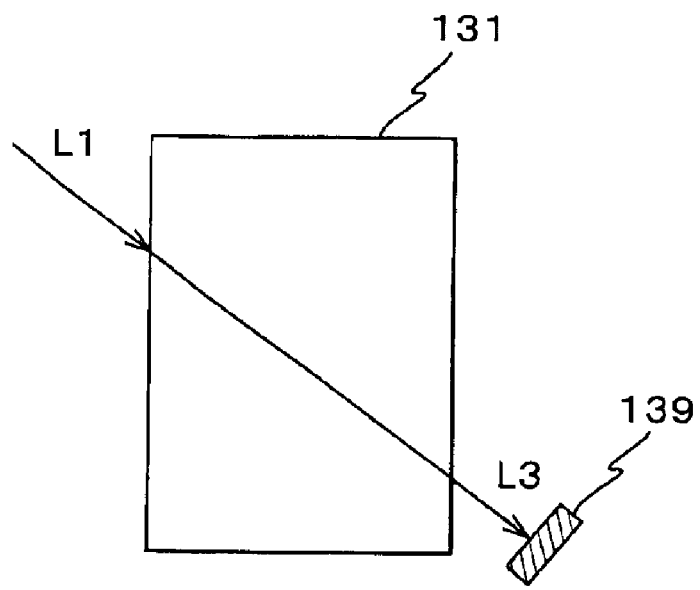
FIGS. 5A and 5B are views for describing how the second light quantity controller operates.

In the second light quantity controller 130, in a state where RF signals are not supplied from signal generating unit 136 in between electrode plates 132 and 134, acoustooptic medium 131 allows light L1, which is emitted from optical amplifying section 161, to substantially pass, and emits the light as light L3, which proceeds in an optical path different from the optical path proceeding to wavelength conversion section 163, as is shown in FIG. 5A. And, light L3 emitted from acoustooptic medium 131 is absorbed by light shielding absorption plate 139. That is, in FIG. 4, when RF signals are not supplied from signal generating unit 136 in between electrode plates 132 and 134, none of the light outgoing from optical amplifying section 161 enters wavelength conversion section 163.

Figure 5B:
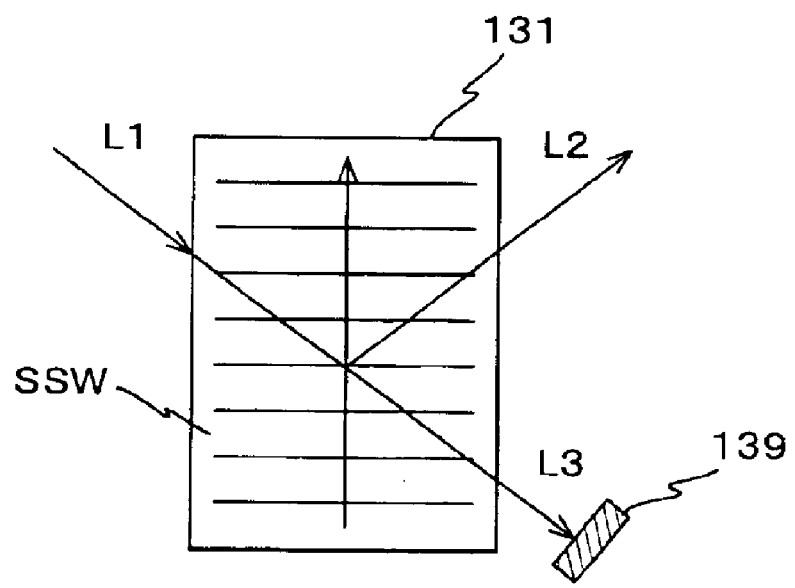

Meanwhile, in a state where RF signals are supplied from signal generating unit 136 in between electrode plates 132 and 134, a compressional wave SSW that proceeds toward acoustic material 135 from transducer 133 is generated in acoustooptic medium 131, as is shown in FIG. 5B. Acoustic material 135 absorbs the ultrasonic waves from transducer 133, and prevents reflection waves from being generated.

When light L1 outgoing from optical amplifying section 161 enters acoustooptic medium 131 in a state where compressional wave SSW is generated, diffraction patterns are generated (Bragg diffraction) and a $0^{th}$ order light is emitted as light L3, which proceeds in an optical path different from the optical path proceeding toward wavelength conversion section 163, and is absorbed by light shielding absorption plate 139. Meanwhile, diffraction light ($1^{st}$ order light) is emitted as a light L2 that proceeds in an optical path toward wavelength conversion section 163. That is, in a state where RF signals are supplied from signal generating unit 136 in between electrode plates 132 and 134, at least a part of light outgoing from optical amplifying section 161 enters wavelength conversion section 163.

Of the light outgoing from optical amplifying section 161, the second light quantity controller 130 controls the light quality of light reaching wavelength conversion section 163, in response to instructions from the first light quantity controller 16C (or furthermore, main controller 50), in the manner described above.

Wavelength conversion section 163 includes a plurality of nonlinear optical crystals and converts the wavelength of pulsed light (light having a wavelength of 1.544 $\mu$m) L2 from the second light quantity controller 130 into, for example, an eighth harmonic wave, and generates a pulsed ultraviolet light that substantially has the same output wavelength as that of the ArF excimer laser (193 nm).

Figure 6:
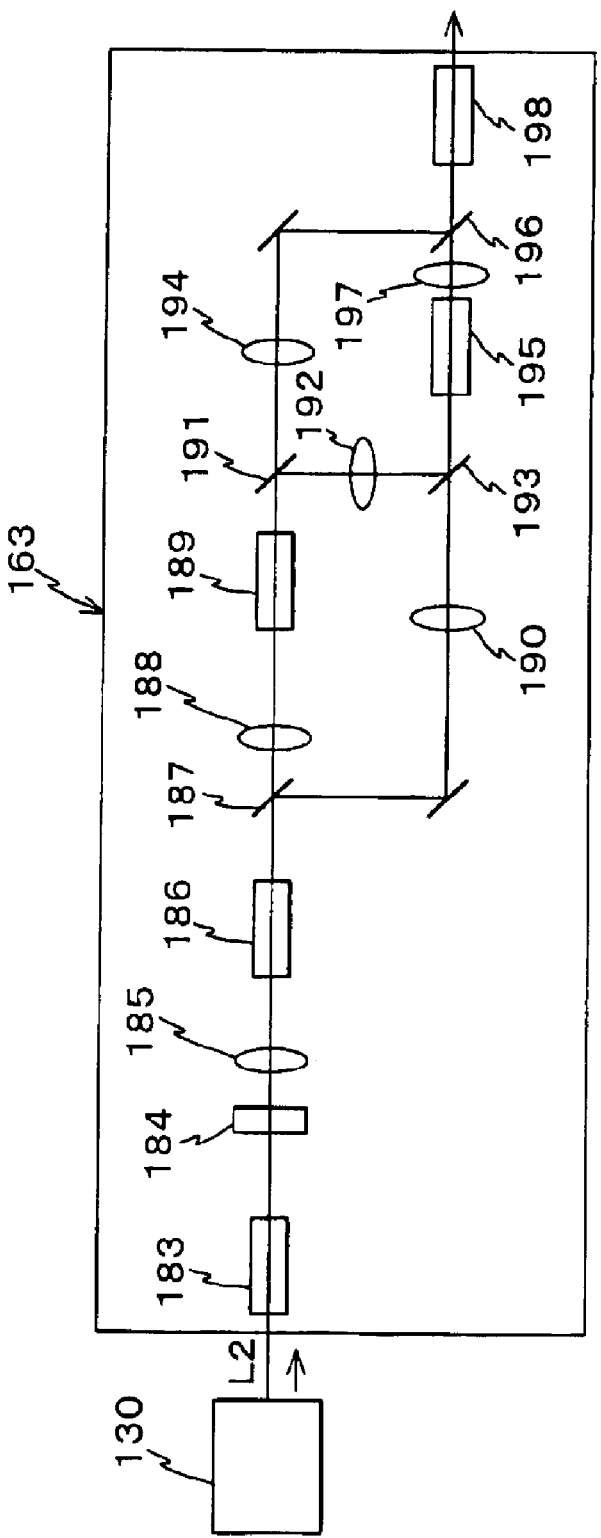
FIG. 6 is a view showing a structure of a wavelength conversion section in FIG. 2.

FIG. 6 shows an example of an arrangement of wavelength conversion section 163. A specific example of wavelength conversion section 163 will be described, referring to FIG. 6. FIG. 6 shows an arrangement example in which light L2 of the wavelength 1.544 $\mu$m outgoing from the second light quantity controller 130 serving as a fundamental wave is converted into an eightfold wave (harmonic wave) using the nonlinear optical crystals, and an ultraviolet light having the wavelength of 193 nm, which is substantially the same wavelength as the ArF excimer laser, is generated.

In wavelength conversion section 163 in FIG. 6, wavelength conversion is performed in the following order: fundamental wave (wavelength: 1.544 $\mu$m)→double wave (wavelength: 772 nm)→triple wave (wavelength: 515 nm)→fourfold wave (wavelength: 386 nm)→sevenfold wave (wavelength: 221 nm)→eightfold wave (wavelength: 193 nm).

More particularly, light L2 (fundamental wave) having the wavelength of 1.544 $\mu$m (frequency $\omega$) outgoing from the second light quantity controller 130 enters a nonlinear optical crystal 183 in the first step. When the fundamental wave passes through nonlinear optical crystal 183, by secondary harmonic generation, a double wave with a frequency two times the frequency $\omega$ of the fundamental wave, that is, a double wave having a frequency 2$\omega$ (wavelength becomes 1/2, 722 nm) is generated.

As nonlinear optical crystal 183 in the first step, a LiB$_3$O$_5$ (LBO) crystal is used, and for phase matching to convert the wavelength of the fundamental wave to a double wave, a method based on temperature adjustment of the LBO crystal, NCPM (Non-Critical Phase Matching), is employed. In NCPM, because angular misalignment (Walk-off) between the fundamental wave and the secondary harmonic wave does not occur within the nonlinear optical crystal, conversion to a double wave is possible with high efficiency, and it is also advantageous for the double wave that is generated because the beam is not deformed due to any walk-off.

The fundamental wave that has passed through nonlinear optical crystal 183 and the double wave generated by the wavelength conversion are given a delay of a half-wavelength and a wavelength in a wave plate 184 in the next step, respectively, and only the polarization direction of the fundamental wave is rotated 90 degrees and then both waves respectively enter a nonlinear optical crystal 186 in the second step via a condenser lens 185. As nonlinear optical crystal 186 in the second step, an LBO crystal is used, and the LBO crystal is used in an NCPM whose temperature is different from the case of nonlinear optical crystal (LBO crystal) 183 in the first step. In nonlinear optical crystal 186, a triple wave (wavelength: 515 nm) is obtained by sum-frequency generation, from the double wave generated in nonlinear optical crystal 183 in the first step and the fundamental wave that has passed through nonlinear optical crystal 183 without being converted.

Next, the triple wave obtained in nonlinear optical crystal 186, and the fundamental and double waves having passed through nonlinear optical crystal 186 without being converted are separated by a dichroic mirror 187, and the triple wave reflected off the dichroic mirror 187 enters a nonlinear optical crystal 195 in the fourth step after proceeding through a condenser lens 190 and a dichroic mirror 193. Meanwhile, the fundamental wave and the double wave that have passed through dichroic mirror 187 then enter a nonlinear optical crystal 189 in the third step, after passing through a condenser lens 188.

As nonlinear optical crystal 189 in the third step, an LBO crystal is used, and the fundamental wave passes through the LBO crystal without being converted, while the double wave is converted into a fourfold wave (wavelength: 386 nm) by secondary harmonic generation. The fourfold wave obtained in nonlinear optical crystal 189 and the fundamental wave that has passed through nonlinear optical crystal 189 is separated using a dichroic mirror 191, and the fundamental wave that has passed through dichroic mirror 191 then passes through a condenser lens 194 and then is reflected off a dichroic mirror 196 and enters a nonlinear optical crystal 198 in the fifth step. Meanwhile, the fourfold wave that is reflected off dichroic mirror 191 passes through a condenser lens 192 and then reaches dichroic mirror 193 where it is coaxially synthesized with the triple wave reflected off dichroic mirror 187 and then enters nonlinear optical crystal 195 in the fourth step.

As nonlinear optical crystal 195 in the fourth step, a $\beta$-BaB$_2$O$_4$ (BBO) crystal is used, and a sevenfold wave (wavelength: 221 nm) is obtained by sum-frequency generation, from the triple wave and the fourfold wave. The sevenfold wave obtained in nonlinear optical crystal 195 passes through a condenser lens 197, and then at dichroic mirror 196, it is coaxially synthesized with the fundamental wave having passed through dichroic mirror 191 and then enters nonlinear optical crystal 198 in the fifth step.

As nonlinear optical crystal 198 in the fifth step, an LBO crystal is used, and an eightfold wave (wavelength: 193 nm) is obtained by sum-frequency generation, from the fundamental wave and the sevenfold wave. In the above arrangement, instead of sevenfold wave generation BBO crystal 195 and eightfold wave generation LBO crystal 198, a CsiB$_6$O$_{10}$ (CLBO) crystal, a Li$_2$B$_4$O$_7$ (LB4) or a CsB$_3$O$_5$ (CBO) crystal can also be used.

Referring back to FIG. 1, illumination optical system 12 is structured including an optical integrator, a variable ND filter, a reticle blind, and the like (each of which are not shown). In this case, as the optical integrator, a fly-eye lens, an internal reflection type integrator (such as a rod integrator), or a diffractive optical element is used. Details on the structure of such an illumination optical system are disclosed in, for example, Japanese Patent Application Laid-open No. 10-112433, and Japanese Patent Application Laid-open No. 06-349701 and its corresponding U.S. Pat. No. 5,534,970. As long as the national laws in designated states or elected states, to which this international application is applied, permit, the above disclosure of the U.S. Patent is incorporated herein by reference.

The optical path of exposure light IL outgoing from illumination optical system 12 is bent vertically downward with a mirror M, and then exposure light IL proceeds through condenser lens 32 and illuminates an illumination area 42R that has a rectangular shape on reticle R, which is held on reticle stage RST, with uniform illumination distribution.

On reticle stage RST, reticle R is mounted and held by suction via a vacuum chuck or the like. Reticle stage RST is movable within a horizontal plane (an XY plane), and a reticle stage drive section 49 scans reticle stage RST within a predetermined stroke range in a scanning direction (in this case, the Y direction, which is the lateral direction on the page surface of FIG. 1). The position and rotation amount of reticle stage RST during the scanning are measured with an external laser interferometer 54R via a movable mirror 52R fixed on reticle stage RST, and measurement values of laser interferometer 54R are supplied to main controller 50.

Projection optical system PL is, for example, a double telecentric reduction system, and is made up of a plurality of lens elements having a common optical axis AX in a Z-axis direction. In addition, as projection optical system PL, a unit whose projection magnification β is, for example, 1/4, 1/5, or 1/6 is used. Therefore, when illumination area 42R in reticle R is illuminated with exposure light IL, an image of a part of an area within illumination area 42R of the pattern formed on reticle R reduced by projection magnification β with projection optical system PL, is formed in a projection area 42W that has a rectangular shape within a field of projection optical system PL and conjugate with illumination area 42R, and the reduced image is transferred onto a resist (photosensitive agent) coated on the surface of wafer W.

XY stage 14 is made so that it can be driven two-dimensionally by a wafer stage drive section 56, in the Y direction serving as the scanning direction and an X direction (the orthogonal direction of the page surface in FIG. 1) perpendicular to the Y direction. On Z tilt stage 58 mounted on XY stage 14, wafer W is held by vacuum chucking or the like via a wafer holder (not shown). Z tilt stage 58 adjusts the position of wafer W in a Z direction (focus position) with, for example, three actuators (such as piezo elements or voice coil motors), and also has the function to adjust the angle of inclination of wafer W with respect to the XY plane (image plane of projection optical system PL). In addition, the position of XY stage 14 is measured with an external laser interferometer 54W via a movable mirror 52W fixed on Z tilt stage 58, and measurement values of laser interferometer 54W are supplied to main controller 50.

In this case, the movable mirror is actually an X movable mirror that has a reflection surface perpendicular to the X-axis and a Y movable mirror that has a reflection surface perpendicular to the Y-axis, and as the laser interferometer corresponding to these mirrors, interferometers are each provided for measuring the X-axis position, the Y-axis position, and rotation (including yawing amount, pitching amount, and rolling amount), however, in FIG. 1, these are representatively shown as movable mirror 52W and laser interferometer 54W.

On Z tilt stage 58, a fiducial mark plate FM is provided, which is used when performing reticle alignment or the like that will be described later in the description. Fiducial mark plate FM is arranged so that its surface is substantially at the same height as the surface of wafer W. On the surface of fiducial mark plate FM, reference marks are formed, such as reference marks for reticle alignment, and reference marks for baseline measurement.

Furthermore, as is shown in FIG. 1, in exposure apparatus 10 in the embodiment, a multiple point focal position detection system (focus sensor) based on an oblique incident method is provided. The system is made up of an irradiation system 60a that irradiates image forming beams to multiple measurement points set on the image forming surface (the XY plane) of projection optical system PL from an oblique direction with respect to the optical axis AX in order to form pinhole or slit images under the control of the main controller, and a photodetection system 60b that receives the image forming beams reflected off the wafer W surface. A detailed configuration of a multiple point focal position detection system similar to the focal position detection system in the embodiment (focus sensor) is disclosed in, for example, Japanese Patent Laid-open 06-283403 and the corresponding U.S. Pat. No. 5,448,332. As long as the national laws in designated states or elected states, to which this international application is applied, permit, the disclosures of the above publication and U.S. Patent are fully incorporated herein by reference.

On scanning exposure or the like, main controller 50 sequentially calculates the Z position of the surface of a part of a shot area where the measurement points are located and the amount of inclination, based on the detected Z position of each measurement point from photodetection system 60b, and based on the calculation results main controller 50 controls the Z position of Z tilt stage 58 via a drive system (not shown) so as to perform auto-focusing (automatic focus adjustment) and auto-leveling.

Main controller 50 is structured including a so-called microcomputer (or a workstation), which is made up of a CPU (central processing unit), a ROM (read-only memory), a RAM (random access memory), and the like, and besides performing various controls that have been described so far, for example, it controls synchronous scanning of reticle R and wafer W, stepping operation of wafer W, exposure timing, and the like so that exposure operation is precisely performed. In addition, in the embodiment, besides performing dose control on scanning exposure, which will be described later in the description, main controller 50 also has overall control over the entire apparatus.

More specifically, for example, on scanning exposure, main controller 50 controls the position and velocity of reticle stage RST and XY stage 14 via reticle stage drive section 49 and wafer stage drive section 56, respectively, based on measurement values of laser interferometers 54R and 54W, so that reticle R is scanned in the +Y direction (or −Y direction) with respect to illumination area 42R at a velocity $V_R = V$ via reticle stage RST, and wafer W is synchronously scanned in the −Y direction (or +Y direction) with respect to projection area 42W at a velocity $V_W = \beta \cdot V$ ($\beta$ is the projection magnification from reticle R to wafer W) via XY stage 14. In addition, on stepping operations, main controller 50 controls the position of XY stage 14 via wafer stage drive section 56, based on measurement values of laser interferometer 54W.

Next, an exposure sequence for performing exposure of a reticle pattern onto wafer W using exposure apparatus 10 in the embodiment will be described, mainly focusing on control operations of main controller 50.

First of all, main controller 50 loads reticle R subject to exposure on reticle stage RST using a reticle loader (not shown).

Next, reticle alignment is performed using a reticle alignment system (not shown), and baseline measurement of an alignment system (not shown) based on an off-axis method is performed using the reference marks referred to earlier. Details on preparatory operations of reticle alignment, baseline measurement, and the like are disclosed in, for example, Japanese Patent Application Laid-open No. 04-324923 and its corresponding U.S. Pat. No. 5,243,195. As long as the national laws in designated states or elected states, to which this international application is applied, permit, the disclosures of the above publication and U.S. Patent are fully incorporated herein by reference.

Then, main controller 50 instructs a wafer carriage system (not shown) to exchange wafer W. With this operation, wafer exchange is performed (when the wafer is not available on the stage, only wafer loading is performed) by wafer carriage system and a wafer delivery mechanism (not shown) on XY stage 14. Because this wafer exchange is performed in the same manner as that of a well-known exposure apparatus, a detailed description is omitted.

Next, a so-called fine alignment is performed using the alignment system on which baseline measured has been performed, such as a series of processing in the alignment process that include wafer alignment based on an EGA method whose details are disclosed in, for example Japanese Patent Application Laid-open No. 61-44429 and its corresponding U.S. Pat. No. 4,780,617. As long as the national laws in designated states or elected states, to which this international application is applied, permit, the disclosures of the above publication and U.S. Patent are fully incorporated herein by reference.

Then, in order to perform scanning exposure on the first shot area on wafer W, main controller 50 synchronously moves reticle stage RST and wafer stage WST via reticle stage drive section 49 and wafer stage drive section 56, based on the above alignment results and measurement values of reticle interferometer system 54R and wafer interferometer 54W (positional information and velocity information). That is, reticle stage RST moves into a state of uniform motion after it begins acceleration and reaches velocity $V_R$ referred to earlier, and wafer stage WST moves into a state of uniform motion after it is moved to an acceleration starting position, the acceleration started, and its velocity reaches velocity $V_W$ referred to earlier. Furthermore, during the above uniform motion, synchronous settlement between reticle stage RST and wafer stage WST is performed. That is, the position of reticle stage RST and wafer stage WST is finely adjusted, so that the positional error between reticle R and wafer W is within a predetermined permissible value.

Then, at the point where the synchronous settlement has been completed and reticle R and wafer W have reached their exposure starting positions, exposure light IL outgoing from light source unit 16 illuminates reticle R, and scanning exposure of the first shot area is performed with exposure light IL that has passed through projection optical system PL.

During such synchronous movement, that is, after the above beginning of acceleration and before beginning scanning exposure, main controller 50 makes pulsed light generation source 16A a continuous optical pulse train via laser controller 16B and the first light quantity controller 16C of light source unit 16. At the same time, main controller 50 drives pumping semiconductor lasers $178_1$ and $178_2$ of optical amplifying section 161 continuously to continuously amplify the optical pulse train outgoing from pulsed light generation source 16A, and also maintains acoustooptic medium 131 of the second light quantity controller 130 in a state where compressional waves SSW are not generated. As a consequence, just before reticle R and wafer W reach their exposure starting positions, respectively, amplifying light L1 (continuous optical pulse train) is outgoing from optical amplifying section 161 stably, however, incident light is not available on wavelength conversion section 163, therefore, light source unit 16 is in a state where it does not emit light (ultraviolet light).

At the same time when wafer W and reticle R reach their exposure starting position, main controller 50 generates compressional waves SSW inside acoustooptic medium 131 via the first light quantity controller 16C. As a result, at least a part of the amplified light outgoing from optical amplifying section 161 enters wavelength conversion section 163, and light source unit 16 begins to emit a pulsed light train.

In addition, when wafer W and reticle R reach their exposure starting position, main controller 50 relatively moves reticle R and wafer W in the manner described above while performing adjustment of the surface position of wafer W via reticle stage drive section 49 and wafer stage drive section 56, based on the Z position information of the wafer detected with the multiple point focal position detection system (60a and 60b), the XY positional information of reticle R measured with reticle interferometer 16, and the XY positional information of wafer W measured with wafer interferometer 28.

In the manner described above, scanning exposure of the first shot area is performed. During such scanning exposure, main controller 50 controls the pulse energy (light quantity) of exposure light IL, by providing instructions to the first light quantity controller 16C to provide a target integrated dose, which is decided according to exposure conditions and resist sensitivity, to wafer W.

Next, when exposure of the first shot area has been completed, main controller 50 cuts off the light outgoing from light source unit 16, by changing the state in acoustooptic medium 131 via the first light quantity controller 16C so that it does not generate compressional waves SSW. In this manner, irradiation of illumination light IL to reticle R is cut off.

In addition, when exposure of the first shot area has been completed, in order to start scanning exposure of the next shot area, wafer stage WST is stepped, and reticle stage RST and wafer stage WST begin synchronous movement. Then, scanning exposure is performed on the next shot area in a manner similar to that of the first shot area. Hereinafter, scanning exposure on each shot area is performed similarly, and exposure of wafer W is completed.

When exposure of wafer W has been completed, main controller 50 stops the optical pulse train outgoing from pulsed light generation source 16A via laser controller 16B and the first light quantity controller 16C of light source unit 16, and also stops the drive of pumping semiconductor lasers $178_1$ and $178_2$ and generation of compressional waves SSW in acoustooptic medium 131. Then, main controller 50 instructs the wafer carriage system (not shown) to exchange wafer W. With this operation, the wafer carriage system and the wafer delivery mechanism (not shown) on XY stage 14 perform wafer exchange. Then, alignment is performed on the wafer after it is exchanged. And, hereinafter, the reticle pattern is transferred onto the plurality of shot areas on the wafer based on the step-and-scan method.

As is obvious from the description so far, in the embodiment, an irradiation optical system that makes up exposure apparatus 10 serving as a light irradiation unit is made up of illumination optical system 12, mirror M, condenser lens 32, and projection optical system PL. However, depending on the type of exposure apparatus, the projection optical system is not always used, therefore, in such a case, an optical system and an optical element disposed between the light source unit and photosensitive object constitute the irradiation optical system.

As is described so far, according to light source unit 16 related to the embodiment, optical amplifying section 161 continuously amplifies the continuous optical pulse train generated by pulsed light generating section 160, and also controls the availability of light proceeding the optical path that leads toward wavelength conversion section 163 with the second light quantity controller 130. As a result, preventing generation of a giant pulse in amplifying optical fiber 175 in optical amplifying section 161 allows a stable wavelength-converted light (ultraviolet light) with high luminance to be emitted on scanning exposure, with good durability.

In addition, an acoustooptic deflector, which uses acoustooptic medium 131, is employed as the second light quantity controller 130, therefore, vibration that is generated when the light proceeding along the optical path toward wavelength conversion section 163 is switched can be suppressed.

In addition, according to exposure apparatus 10 in the embodiment, because a stable illumination light IL with high luminance can be irradiated on reticle R on scanning exposure, the pattern formed on reticle R can be transferred effectively onto wafer W with good accuracy.

Figure 7:
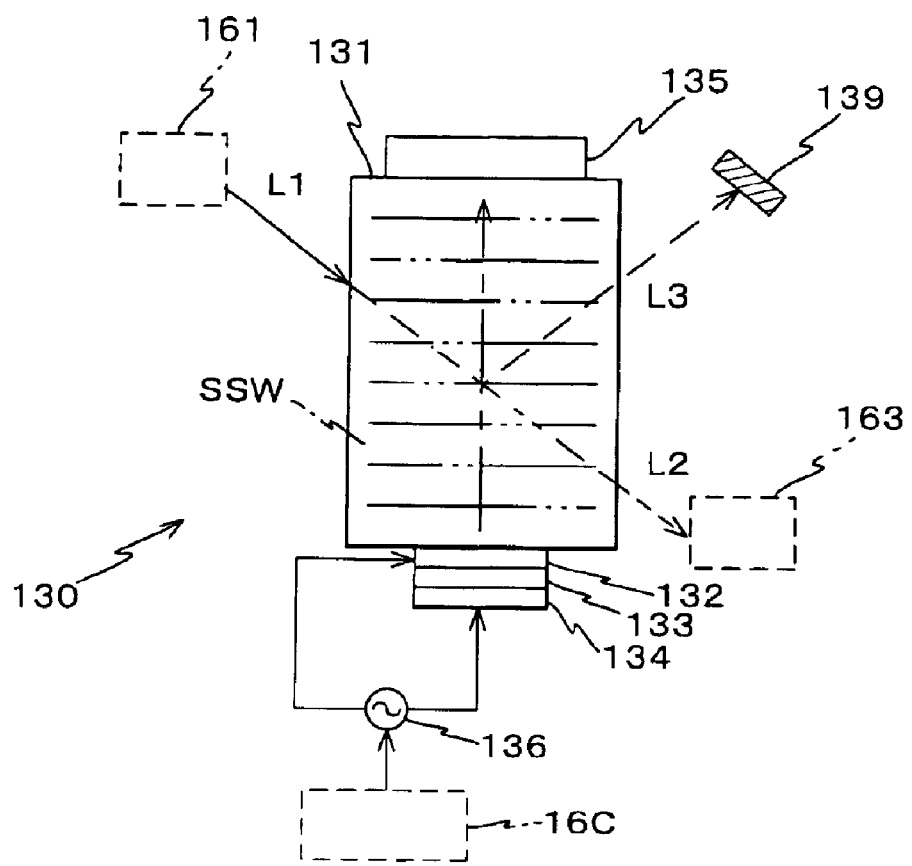
FIG. 7 is a view for describing a modified example.

In the above embodiment, the structure has been described where the $1^{st}$ order diffraction light, which is generated when the compressional waves are generated in acoustooptic medium 131, proceeds the optical path to wavelength conversion section 163, however, when the intensity of the $0^{th}$ order light can be sufficiently small while the compressional waves are generated in acoustooptic medium 131, the transmitted light when compressional waves are not generated in acoustooptic medium 131 may be made to proceed the optical path to wavelength conversion section 163, as is shown in FIG. 7. In this arrangement, when compressional waves SSW are generated in acoustooptic medium 131, the diffraction light ($1^{st}$ order) will be incident on light shielding absorption plate 139. In FIG. 7, the members that are the same as those in FIG. 4 have the same references, and their descriptions omitted. In addition, instead of light shielding absorption plate 139, for example, a wavelength monitor or light quantity monitor may be disposed, to make wavelength, wavelength width, light amount, and the like made detectable while the light is being kept from entering wavelength conversion section 163.

In addition, the arrangement of the wavelength conversion section in the above embodiment is an example, therefore, as a matter of course, the arrangement of the wavelength conversion section, material for the nonlinear optical crystal, output wavelength, and the like in the present invention are not limited to this. For example, a fundamental wave having a wavelength of 1.57 μm emitted from optical amplifying section 163 can be made into an ultraviolet light having a wavelength of 157 nm, which is the same as the $F_2$ laser, by performing a tenfold harmonic wave generation using nonlinear crystals. In addition, when an eightfold wave generation is performed by sum-frequency generation, CBO crystal can be used.

In addition, in the above embodiment, as laser light source 160A, DFB semiconductor laser is used, however, other semiconductor lasers, or for example, fiber laser such as an ytterbium (Yb) doped fiber laser whose oscillation wavelength is around 990 nm, can also be used.

In addition, in the above embodiment, as the amplifying optical fiber an Er doped fiber is employed, however, a Yb doped fiber or other fibers such as a rare-earth element doped fiber can also be employed.

In addition, in the above embodiment, as the amplifying medium, an optical fiber that has a rare-earth element added to its core has been employed, however, for example, a rod shaped vitreous body that has a rare-earth element added to its core may be employed, and the exciting light irradiated on such body.

In addition, in the optical amplifying section 161, the number of optical fiber amplifiers 167 that are arranged in parallel may be any number, and the number can be decided according to the specification required in a product to which the light source unit related to the present invention is applied. Especially, as a light source unit when high output is not required, the number of optical fiber amplifiers 167 can be reduced, and the arrangement simplified. When the number of optical fiber amplifiers 167 is simplified so that it includes only one, optical branching device 166 will also be unnecessary.

In addition, connecting the optical fiber amplifiers in serial can increase the optical amplifying ratio of one path. In such a case, in between the optical fiber amplifiers and the wavelength conversion section where the giant pulse is likely to affect, a light quantity controller similar to the second light quantity controller 130 in the above embodiment may be provided.

In addition, in the above embodiment, the wavelength of the ultraviolet light outgoing from the light source unit is set substantially the same as the ArF excimer laser, however, the set wavelength may be any wavelength, so long as the oscillation wavelength of laser light source 160A, the arrangement of wavelength conversion section 163, the magnification of the harmonic wave, and the like are decided according to the wavelength. By way of example, the set wavelength may be decided according to the design rule (such as line width and pitch) of the pattern to be transferred onto the wafer, or furthermore, when deciding the set wavelength, points such as the exposure conditions and reticle type (whether it is a phase shift type or not) referred to earlier may also be taken into consideration.

In addition, in the above embodiment, the case has been described where the light source unit related to the present invention is used in a scanning exposure apparatus based on the step-and-scan method. However, the light source unit related to the present invention can also be applied to equipment other than an exposure apparatus, such as equipment used in a device manufacturing process, as in a laser repair system, which is used to cut off a part of a circuit pattern (such as a fuse) formed on the wafer. In addition, the present invention can also be suitably applied to not only a scanning exposure apparatus based on the step-and-scan method, but also to a static type exposure apparatus, such as an exposure apparatus based on the step-and-repeat method (such as a stepper). Furthermore, the present invention can also be applied to an exposure apparatus based on the step-and-stitch method, a mirror projection aligner, and the like.

In addition, in the above embodiment, the example has been described where the light source unit in the present invention is used as a light source unit that generates the exposure illumination light. However, the light source in the present invention can also be used as a light source unit used for reticle alignment described above that requires light having substantially the same wavelength as the exposure illumination light, or as a light source unit of an aerial image detection system that obtains optical properties of the projection optical system by detecting projected images of marks arranged on the object surface or the image plane of the projection optical system.

The light source unit in the present invention can also be used in equipment of other types, besides an exposure apparatus. For example, it can be used as a light source unit used in a laser treatment system, which performs treatment of nearsightedness, astigmatism, or the like, correcting the curvature or the unevenness of the cornea by irradiating a laser beam and performing ablation on the corneal layer (or ablation on the inner cornea). In addition, the light source related to the present invention can also be used as a light source unit in optical inspection equipment or the like.

In addition, the light source unit related to the present invention can also be used for optical adjustment (such as optical axis adjustment) or for inspection of an optical system such as the projection optical system in the above embodiment. Furthermore, in equipment of various types that use an excimer laser as its light source, the light source related to the present invention can be applied, instead of the excimer laser.

Next, a manufacturing method of devices (such as a semiconductor chip as in an IC or an LSI, a liquid crystal display panel, a CCD, a thin film magnetic head, or a micromachine) will be described.

First of all, in the design step, the functional design for a device (such as circuit design for a semiconductor device) is performed, and pattern design is performed to implement the functions designed. Then, in the mask manufacturing step, a mask (or a reticle) on which the designed circuit pattern is formed is manufactured. Meanwhile, in the wafer manufacturing step, a wafer is manufactured by using a silicon material or the like.

Next, in the wafer processing step, an actual circuit and the like is formed on the wafer by lithography in the manner which will be described later, using the mask (or the reticle) and wafer prepared in the above steps.

In the wafer processing step, when manufacturing a semiconductor device, for example, it has a pre-processing process for each stage in the wafer process, such as an oxidation step for oxidizing the surface of the wafer, a CVD step for forming an insulating film on the wafer surface, an electrode formation step for forming electrodes on the wafer by vapor deposition, ion implantation step for implanting ions into the wafer, and a post-processing process, which will be described later. The pre-processing process is selectively executed, depending on the processing required in the respective steps.

When the above pre-processing process is completed in each stage of the wafer process, in the resist formation step, the wafer is coated with a photosensitive agent. Then, in the exposure step, the circuit pattern on the mask (or the reticle) is transferred onto the wafer by exposure apparatus 10 in the above description, that is, exposure of the wafer is performed. Next, the wafer that has been exposed is developed in the development step, and then, in the etching step, an exposed member of an area other than the area where the resist remains is removed by etching. And then, in the resist removing step, the resist that is no longer necessary since etching is completed is removed.

By repeatedly performing the pre-processing process and post-processing process from the resist formation step to the resist removing step, a circuit pattern of multiple layers is formed on the wafer.

When the wafer processing step is completed in the manner described above, in the assembly step, the wafer that has been processed in the wafer processing step is assembled into a chip. Such assembly includes processes such as the assembly process (dicing and bonding), and packaging (chip encapsulation).

Finally, in the inspection step, tests on operation, durability, and the like are performed on the device manufactured in the assembly step. After these processes, the device is completed and shipped out.

In the manner described above, a device on which fine patterns are accurately formed is manufactured with high productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A light source unit, said unit comprising:
    a light generating section that generates light having a single wavelength within a wavelength range of infrared to visible region;
    an optical amplifying section that is optically connected to said light generating section and includes a specific amplifying medium that amplifies said generated light;
    a wavelength conversion section that is optically connected to said optical amplifying section and performs wavelength conversion of said amplified light into ultraviolet light; and
    a light quantity control section partly disposed on a predetermined optical path from said specific amplifying medium to said wavelength conversion section, said control section controlling light quantity of light proceeding said optical path after being emitted from said specific amplifying medium so that said ultraviolet light is not emitted from said wavelength conversion section while light enters said specific amplifying medium.

2. The light source unit of claim 1 wherein
    a plurality of amplifying mediums is provided on an optical path inside said optical amplifying section, and
    said specific amplifying medium is an amplifying medium provided optically most downstream among the plurality of amplifying mediums.

3. The light source unit of claim 1 wherein
    a plurality of amplifying mediums that may be affected by a giant pulse is provided on an optical path inside said optical amplifying section, and
    said specific amplifying medium is an amplifying medium provided optically most downstream among the plurality of amplifying mediums.

4. The light source unit of claim 1 wherein
    said specific amplifying medium is an amplifying optical fiber.

5. The light source unit of claim 1 wherein
    said light quantity control section comprises:
    an acoustooptic medium disposed on said predetermined optical path; and
    a compressional wave generator that generates a compressional wave proceeding in a predetermined direction, in said acoustooptic medium.

6. The light source unit of claim 5 wherein
    said predetermined direction is a direction oblique to a proceeding direction of light that has entered said acoustooptic medium, when said compressional wave is not generated in said acoustooptic medium.

7. The light source unit of claim 5 wherein
    when said compressional wave is generated in said acoustooptic medium, at least a part of light outgoing from said specific amplifying medium proceeds said predetermined optical path, and when said compressional wave is not generated in said acoustooptic medium, light outgoing from said specific amplifying medium proceeds an optical path different from said predetermined optical path.

8. The light source unit of claim 5 wherein
    when said compressional wave is generated in said acoustooptic medium, at least a part of light outgoing from said specific amplifying medium proceeds an optical path different from said predetermined optical path, and when said compressional wave is not generated in said acoustooptic medium, light outgoing from said specific amplifying medium proceeds said predetermined optical path.

9. The light source unit of claim 5 wherein said light quantity control section includes a member that prevents a reflection wave from being generated in said compressional wave generator.

10. The light source unit of claim 1 wherein said light quantity control section sets a first state where said ultraviolet light is emitted from said wavelength conversion section and a second state where said ultraviolet light is not emitted, by switching a proceeding direction of said amplified light.

11. The light source unit of claim 10 wherein in said second state, said amplified light is kept from entering said wavelength conversion section.

12. A light irradiation unit that irradiates light onto an object, said unit comprising:

the light source unit of claim 1; and an irradiation optical system that emits light outgoing from said light source unit to said object.

13. The light irradiation unit of claim 12 wherein said object is a photosensitive object.

14. A device manufacturing method including a lithographic process, wherein in said lithographic process, exposure of said photosensitive object is performed using said light irradiation unit of claim 13.

15. The light irradiation unit of claim 12, wherein said light irradiation unit is a laser treatment system that irradiates said ultraviolet light on the cornea.

16. An exposure apparatus that transfers a pattern of a first object onto a second object, said apparatus comprising:

the light source unit of claim 1; and an illumination optical system that irradiates an illumination light outgoing from said light source unit onto said first object, and said apparatus exposes said second object with said illumination light via said first object.

17. The exposure apparatus of claim 16, said apparatus further comprising:

a stage system that moves said first object and said second object synchronously with respect to said illumination light, to perform scanning exposure on said second object with said illumination light; and a control unit that makes said illumination light enter said illumination optical system after said synchronous movement has begun and before beginning said scanning exposure, and controls irradiation of said illumination light to said first object via said light quantity control section.

18. The exposure apparatus of claim 17, said apparatus further comprising:

a projection optical system that projects a pattern image of said first object onto said second object; and a mark detection system that detects a mark with an illumination light outgoing from said light source unit via said projection optical system.

19. An exposure apparatus, comprising an illumination optical system that irradiates an exposure light on a first object, and a projection optical system that projects a pattern image of said first object on a second object, said apparatus comprising:

the light source unit of claim 1; and a mark detection system that detects a mark with an illumination light of substantially the same wavelength as said exposure light outgoing from said light source unit via said projection optical system.

20. An equipment that is used in a device manufacturing process, comprising:

the light source unit of claim 1, wherein a main body of said equipment is optically connected to said light source unit.

21. The equipment of claim 20, including:

an inspection equipment.

* * * * *